(12) United States Patent
Shaw

(10) Patent No.: US 6,888,860 B2
(45) Date of Patent: May 3, 2005

(54) LOW COST OPTICAL BENCH HAVING HIGH THERMAL CONDUCTIVITY

(75) Inventor: Mark A. Shaw, Milan (IT)

(73) Assignee: Corning Incorporated, Corning, NY (US)

( * ) Notice: Subject to any disclaimer, the term of this patent is extended or adjusted under 35 U.S.C. 154(b) by 306 days.

(21) Appl. No.: 10/012,144

(22) Filed: Dec. 7, 2001

(65) Prior Publication Data

US 2002/0085598 A1 Jul. 4, 2002

Related U.S. Application Data

(60) Provisional application No. 60/259,206, filed on Jan. 3, 2001.

(30) Foreign Application Priority Data

Dec. 28, 2000 (EP) ............................................ 00128596

(51) Int. Cl.[7] .................................................. H01S 3/04
(52) U.S. Cl. ............................. 372/36; 372/34; 372/33
(58) Field of Search ...................................... 372/36, 33

(56) References Cited

U.S. PATENT DOCUMENTS

| 4,807,956 | A |   | 2/1989 | Tournereau et al. | ........ 350/96.2 |
| 5,812,716 | A | * | 9/1998 | Ohishi | ........................ 385/92 |
| 6,061,374 | A | * | 5/2000 | Nightingale et al. | ........... 372/43 |
| 6,383,835 | B1 | * | 5/2002 | Hata et al. | ..................... 438/65 |

FOREIGN PATENT DOCUMENTS

| DE | 4422322 C1 | 9/1995 |
| EP | 0 579 439 A1 | 7/1993 |
| JP | 60110185 | 6/1985 |
| JP | 62260385 | 12/1987 |
| JP | 63142686 | 6/1988 |
| JP | 03120884 | 5/1991 |
| JP | 01550146 | 6/1993 |
| JP | 08316503 | 11/1996 |
| JP | 10144997 | 5/1998 |
| JP | 10239570 | 11/1998 |

* cited by examiner

Primary Examiner—Minsun Oh Harvey
Assistant Examiner—Dung Nguyen
(74) Attorney, Agent, or Firm—Juliana Agon

(57) ABSTRACT

The invention relates with an optical bench for optoelectronic packages comprising a rigid insulating substrate, the substrate having a top surface along which it is defined an optical axis, the substrate comprising: a device region for mounting at least an optoelectronic device in alignment with the optical axis, and a fixing region adjacent to the device region for affixing at least an optical component in alignment with the optical axis. The substrate further comprises a third region provided with metallised tracks, the third region extending over the substrate top surface along at least part of one side of the fixing region in a direction substantially parallel to the optical axis. The invention also relates with an optical bench comprising: a single baseplate having a device region and a fixing region; a welding platform mounted directly on said fixing region; a heat sink mounted directly on said device region; and an optoelectronic device directly mounted on said heat sink.

19 Claims, 6 Drawing Sheets

LOW COST OPTICAL BENCH HAVING HIGH THERMAL CONDUCTIVITY

CLAIM OF PRIORITY

This application claims the benefit of European Application 00128596.41 filed Dec. 28, 2000 and U.S. Provisional Application 60/259,206 filed Jan. 3, 2001.

BACKGROUND OF THE INVENTION

1. Field of the Invention

The invention relates to an optical bench and to an optoelectronic package for housing at least an active optoelectronic device and its associated electronic circuit elements. In particular, the invention concerns a low cost thermally controlled optoelectronic package.

2. Related Art

In high-power laser devices, the laser unit, laser diode or laser diode chip, is generally mounted on a heat-sink made of a material with high thermal conductivity, such as diamond, SiC or AlN, for thermal dissipation during operation of the laser. The heat-sink is bonded onto a circuit board, which can accommodate all or part of the complementary internal devices of the laser package, such as a thermistor, a back-field photodetector and circuit patterns. Optical components, in particular optical fibres and lenses, are fixed in optically aligned position in front of the laser with the help of holding and aligning members (e.g., ferrule, saddle, clip). Holding and aligning members (herein also generally referred to as optical members) for fibres and lenses are fixed commonly by laser welding to a welding platform. To avoid displacement shifts, optical members and welding platform are generally made of a material with low thermal expansion coefficient. To this purpose, Kovar (an iron alloy comprising cobalt and nickel), stainless steel or Invar are often preferred. The baseplate on which the optical members are placed is also referred to as optical bench. The assembly comprising the optical bench and the circuit board is also referred to as the optical assembly. The optical assembly mounting the laser is generally placed on a thermoelectric cooler (TEC) in order to stabilise the laser temperature during operation.

In article 'Automated Fiber Attachment for 980 nm Pump Modules' by P. Mueller and B. Valk, IEEE Electronic Components and Technology Conference 2000, a laser diode on a AlN submount, a thermistor, a photodiode and an ESD (electrostatic dissipation device) are soldered onto an $AlO_x$-circuit board. The circuit board is placed on a baseplate, which is mounted on a thermoelectric cooler (TEC). A fibre with support tube is welded to a clip, which is fixed on the free side of the baseplate. Clip, weld platform and fibre support tube are made of Kovar.

In PCT patent application WO 97/05513 a laser diode is placed on a substrate of alumina, which carries also different connections and other electronic components. The circuit board is mounted onto a metallic baseplate, preferably made of an alloy of chromium-nickel, such as Kovar. Kovar is said to be preferred because of its thermal compatibility with alumina substrates.

As the optical bench needs to be placed on a TEC, Applicants have observed that using a material with poor thermal conductivity, such as Kovar, for the baseplate does not allow proper heat dissipation over the TEC top surface.

Article 'Laser Diode Packaging Technology: 980 nm EDFA Pump Lasers for Telecommunication Applications' by Mobarhan K. S. and Heyler R., that was available on Oct. 24, 2000, in the Internet at the URL address http://www.newport.com/Support/Application_Notes/APPNOTES3.pdf, describes an optical subassembly that is a miniature aluminium nitride based optical bench containing the laser chip, laser diode submount, photodiode, and various other components. The optical subassembly also includes a relatively large metal platform onto which all the fiber pigtailing components are welded.

With regard to the packages that house the laser unit, presently 14-pin butterfly packages have become standardised throughout the industry for laser packaging, e.g., for 980 nm pump laser devices or 920 nm multimode lasers for fibre lasers or Raman amplifiers, since they enable customers to source from more than one supplier. In a butterfly type package terminal pins extend from the side surfaces of the package to be substantially parallel to the optical bench/circuit board. Electrical connections between the internal devices and the terminal pins are performed through wires or the like. The design of butterfly packages with standard position of the pin-out constrains the internal construction of laser modules as the position of the electrode pads (circuit patterns) of the internal devices (laser, photodetector, ESD, etc.) should substantially face the corresponding terminal pin in order to avoid the presence of long flying wires inside the package. This has lead to the development of ceramic terminal feed-through's, which extend through the side surfaces of the package and comprise a ceramic block provided with metallised pads from inside to outside the package for electrical connection to terminal pins. Metallised pads on the ceramic block can be designed to bridge the distance between the electrode pad of an internal device and the corresponding terminal pins. Examples of butterfly laser packages having ceramic terminal feed-through are given in U.S. Pat. Nos. 5,963,695, 5,930,430, and 5,195,102.

FIG. 1 shows a conventional optical bench applicable to 980 nm pump laser packages. The optical bench 1 comprises a baseplate 2 made of aluminium nitride (AlN). A circuit board 3 made also of AlN is bonded to the baseplate 2, which acts as a rigid support for the circuit board and for a Kovar welding platform 6, which is a single mounting block. To the Kovar platform optical components, e.g., fibre or lenses, will be fixed, e.g., by laser welding, in optically aligned positions with the help of holding and aligning members (not shown). FIG. 1(b) shows the top view of the conventional optical bench. On the circuit board 3, the laser 5 placed on the heat-sink 4 is mounted, plus some of internal complementary devices: electrostatic discharge element (ESD) 9, a back-field detector 10 and a thermistor 12. The circuit board is provided with metallised tracks (circuit patterns) 19.

The circuit board and the Kovar platform are bonded to the baseplate 2 with Au/Sn solder 8. A heat-sink 4 is placed on the circuit board 3 as submount for laser chip 5. The heat-sink is made of SiC, a material with high thermal conductivity. The heat-sink 4 is soldered to the circuit board 3 by Pb/Sn solder 11.

FIG. 2 shows the plan view of the 14-pin butterfly package 20 housing the optical bench of FIG. 1. Two ceramic terminal feed-through's 15 for the pin-out are provided with metallised pads 13 for connecting the internal devices (TEC, laser, thermistor, etc.) to the corresponding external terminal pins 14. Shape and length of the metallised pads are designed so as to shorten the distance between the electrode pads of the devices and the corresponding pins. Wires 16 connect the electrode pads of the internal devices to the metallised pads 13 of the ceramic feed-through's 15. The dotted-dashed line 22 indicates the optical axis of the optical bench (and of the package), i.e., the main emitting beam path of the laser to which the optical component, such as a fibre, is aligned. The baseplate 2 is mounted on a TEC, in this case a Peltier device (not visible).

Manufacture of packages with ceramic terminal feed-through for pin-out, as that described in FIG. 2, adds high costs to package fabrication, especially if compared to the seal-around technology. In seal-around technology, straight pins extend through apertures made on the side (butterfly type package) or on the bottom (dual in-line type package) surfaces of the package. Hermetic sealing, generally using glass or ceramic material, around the pins provides the means for sealing the pins to the package.

Applicants have observed that the seal-around technology in laser packages would be an attractive alternative to the ceramic terminal feed-through since it would lower manufacturing costs. They have remarked that an optical assembly (i.e., comprising the circuit board and the optical bench) according to FIGS. 1 and 2 is not suitable to packages that use seal-around technology. In said conventional optical assembly, the circuit board, provided with circuit patterns, is placed on a baseplate. In the longitudinal direction with respect to the package, i.e., in a direction substantially parallel to the optical axis 22, the circuit board extends only over a portion of the package. In a package with no ceramic feed-through, the use of such an assembly would then imply the presence of long electrical connections (wires or the like), thereby increasing the electrical inductance and the encumbrance inside the package.

Applicants have further observed that in the conventional optical assembly of FIG. 1, during laser operation, the heat produced by the laser spreads from the heat-sink to the circuit board and to the adjacent welding platform, it diffuses through the baseplate to reach finally the TEC top surface. In this way, heat dissipation does not occur over the whole TEC top surface as the welding platform, which is made of a material with poor thermal conductivity (e.g., Kovar), hinders efficient thermal dissipation in the direction essentially parallel to the TEC surface. Furthermore, heat spreading from the laser to the TEC surface has to follow a relatively long thermal path, i.e., through the heat-sink, the circuit board and finally the baseplate, thereby increasing the thermal resistance. The relatively large thermal resistance in the partially hindered heat flow to the TEC cause a loss in the TEC cooling efficiency with consequent increase in power consumption of the package.

SUMMARY OF THE INVENTION

The invention relates, in a first aspect, to an optical bench for optoelectronic packages comprising an insulating substrate that is provided with metallised tracks extending in a direction substantially parallel to the optical axis of the optical bench.

Preferably, the substrate is made of a material with high thermal conductivity. More preferably, the substrate is made of a ceramic material, such as an AlN based material. The optical bench according to the present invention has excellent heat dissipation properties and a design that facilitates laser-welding operations of the optical members, such as fibre's holding and aligning members, without compromising the thermal properties.

The new optical bench allows easy and correct connection to the external pins of packages, for packages either supplied with a ceramic terminal feed-through or manufactured using seal-around pin-out technology. With this new design, electrode pads of the internal devices can be situated opposite to the corresponding terminal pin so that the presence of long flying wires inside the package is avoided. As it will become clear from the description, the design of the new optical bench is compatible with standard pin-out optoelectronic packages, such as 14-pin butterfly packages and dual in-line (DIP) packages, and allows achieving cost reduction in package manufacture. Further advantages of the present invention will become clear from the detailed description of the preferred embodiments.

In particular the invention relates, in a first aspect, to an optical bench for optoelectronic packages comprising a rigid insulating substrate, said substrate having a top surface along which it is defined an optical axis, the substrate comprising a device region for mounting at least an optoelectronic device in alignment with said optical axis, and a fixing region adjacent to the device region for affixing at least an optical component in alignment with the optical axis, wherein said substrate further comprises a third region provided with metallised tracks, said third region extending over the substrate top surface along at least part of one side of said fixing region in a direction substantially parallel to the optical axis.

The invention relates also to a packaged optoelectronic device comprising:

a package;

at least a row of external terminal pins for electrical connection to the exterior of the package, said row extending in a direction substantially parallel to a package surface, and an optical bench housed in said package comprising a rigid insulating substrate, said substrate having a top surface along which it is defined an optical axis substantially parallel to said row of external terminal pins, wherein;

said substrate comprises a device region having at least an optoelectronic device mounted thereon, a light path of the optoelectronic device being aligned with said optical axis, and a fixing region adjacent to the device region for affixing an optical fibre in a position aligned with the optical axis, said substrate further comprises a third region provided with metallised tracks, said third region extending over the substrate top surface along at least part of one side of said fixing region in a direction substantially parallel to the optical axis.

Said metallised tracks are electrically connected to said terminal pins and/or to said optoelectronic device.

According to another aspect, the present invention relates to an optical bench comprising a single ceramic baseplate that mounts a welding platform. An optoelectronic device is mounted directly on a heat sink that is mounted directly on the baseplate. With this design, heat transfer occurs only across a heat sink and a single ceramic baseplate, thereby reducing the thermal resistance from the optoelectronic device to the TEC surface and manufacturing costs.

The invention will be better understood from the following detailed description, given solely by way of example, which should be considered in conjunction with the accompanying drawings in which:

FIG. 1(*b*) is a top view of the conventional optical assembly of FIG. 1(*a*).

DETAILED DESCRIPTION OF THE PREFERRED EMBODIMENTS

Figure 3A:
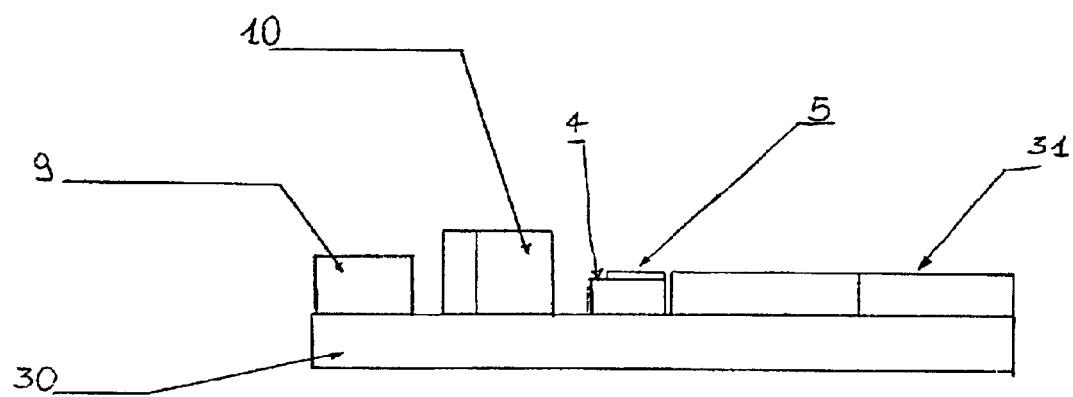
FIG. 3(a) is a side view of an optical bench according to a first embodiment of the invention.
Figure 3B:
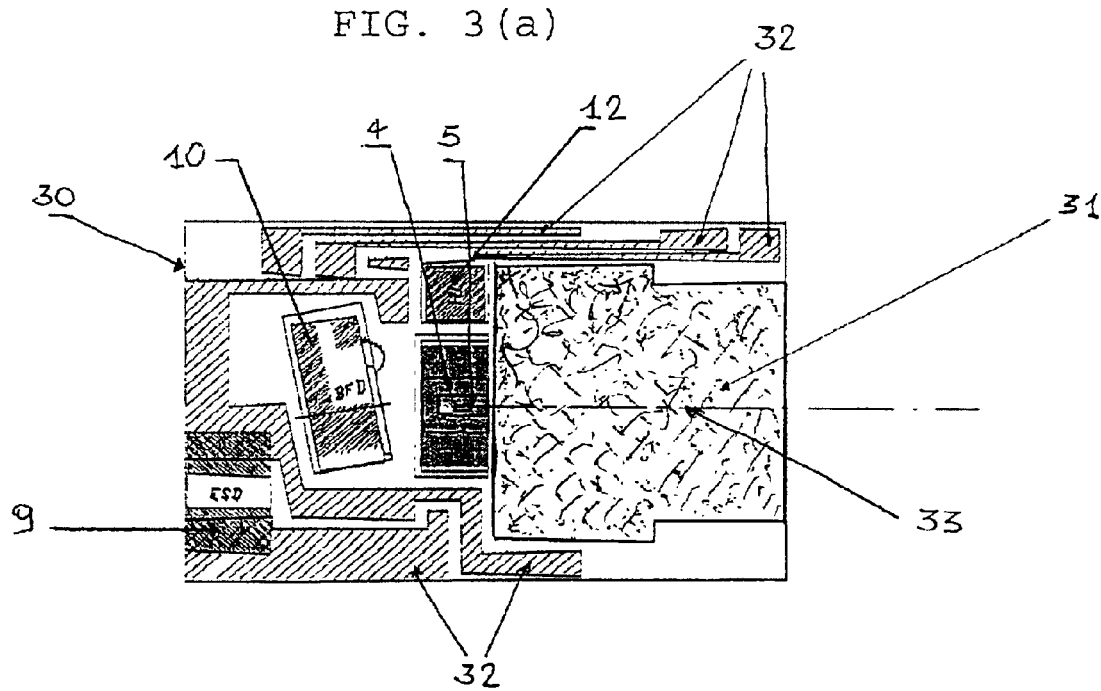
FIG. 3(b) is a top view of an optical bench according to the first embodiment of the invention.

The optical bench according to the first embodiment of the present invention is shown in FIG. 3. The optical bench comprises a single insulating baseplate or substrate 30. Welding platform 31, heat-sink 4 with laser unit 5 (laser diode or laser diode chip) and complementary internal devices, such as ESD 9, back-field detector 10 and thermistor 12, are mounted directly on top of the ceramic baseplate 30. Complementary internal devices can be bonded to the ceramic baseplate by the use of solder or by co-firing. FIG. 3(b) illustrates a top view of the baseplate 30. The dotted-dashed line 33 indicates the optical axis of baseplate. The laser is aligned so that its light emission is directed substantially along the optical axis of the baseplate. Peripheral metallised tracks 32 extend over at least part of the baseplate surface in a direction substantially parallel to the optical axis 33. Metallised tracks or circuit patterns 32 can be made for instance by the techniques of thin film (lithography) or of thick film (printing). In a preferred embodiment, metallized tracks 32 extend over an area of baseplate 30 which is elongated substantially along the optical axis on one side or on both sides of the area reserved for mounting welding platform 31. Metallized tracks can thus lead to terminal pads on baseplate 30 that can, once the baseplate is mounted in the package, be close to any corresponding terminal pin, or to any corresponding metallised pad of a terminal pin on a package feed-through. Baseplate 30 functions both as optical bench and as circuit board. Welding platform 31 can be made, for example, of any material that allows laser welding, such as Kovar. Examples of alternative materials for the welding platform are Invar or stainless steel. Welding platform 31 can be bonded to the baseplate by high-temperature solder, such as Au/Ge or Au/Sn.

Baseplate 30 is preferably made of a material having a high thermal conductivity, such as a ceramic material. More preferably, the baseplate is made of AlN based material. Herein, AlN based materials means, besides pure AlN, ceramic composites or physical mixtures containing AlN. Examples of AlN based materials are given in U.S. Pat. Nos. 5,102,749 and 5,133,403. Other possible choices of thermally conductive ceramic materials for the baseplate could be $AlO_x$, alumina ($Al_2O_3$), beryllia (BeO) or boron nitride (BN). Non ceramic materials, such as thermoset resins can be also used for the baseplate unless organic materials are to be avoided to prevent contamination of the devices in the package. In selecting the material for the baseplate a major requirement is a thermal conductivity sufficiently high for efficient power dissipation. For example, for a 980 nm power laser with dissipated power of about 300 mW housed in a package that dissipates a maximum power of 100 mW to the optical bench (with a maximum external temperature of 65° C.), thermal conductivity of the material forming the baseplate is preferably not smaller than about 140 W/mK.

Heat-sink 4 mounting the optoelectronic device is preferably of a material selected from diamond, SiC, AlN, AlSi, Cu—W or Al—Si—C alloys.

In FIG. 3 the welding platform 31 is indicated as a single mounting block. However, different designs of welding platform can be contemplated depending on the aligning method for the fibre-laser optical coupling that will be used.

In the first embodiment shown in FIG. 3, a single ceramic baseplate, also referred to as substrate, combines the function of being a rigid support for the optical members with the function of the circuit board. This allows a simplified construction since the manufacturing step of bonding the circuit board on the baseplate is eliminated, thereby reducing manufacturing costs. Moreover, during laser operation heat can spread radially from the heat-sink to the ceramic baseplate and then to the TEC top surface without being hindered from the poorly thermally conductive welding platform, thereby improving the efficiency in heat dissipation. In addition, since heat spreading occurs only across the single ceramic baseplate, thermal resistance is reduced. Although a thickness of the baseplate as small as possible could be preferable for minimising the thermal resistance, one should consider that heat spreads radially from a relatively small source (e.g., laser) with respect to the size of the optical bench surface. Heat can spread over a large portion of the optical bench bottom surface and, consequently, of the TEC top surface, if the optical bench has a sufficiently large thickness. As an example, for an optical bench made of a material having thermal conductivity of about 140 mW/K (e.g., AlN) and mounting an optoelectronic device that dissipates the power of about 300 mW, the thickness is preferably comprised between 1 mm and 2 mm. It is to be understood that if the material has a larger thermal conductivity (e.g., diamond or BN), the thickness of the optical bench fulfilling the balance between efficient heat spreading and a relatively small thermal resistance reduces.

Figure 1A:
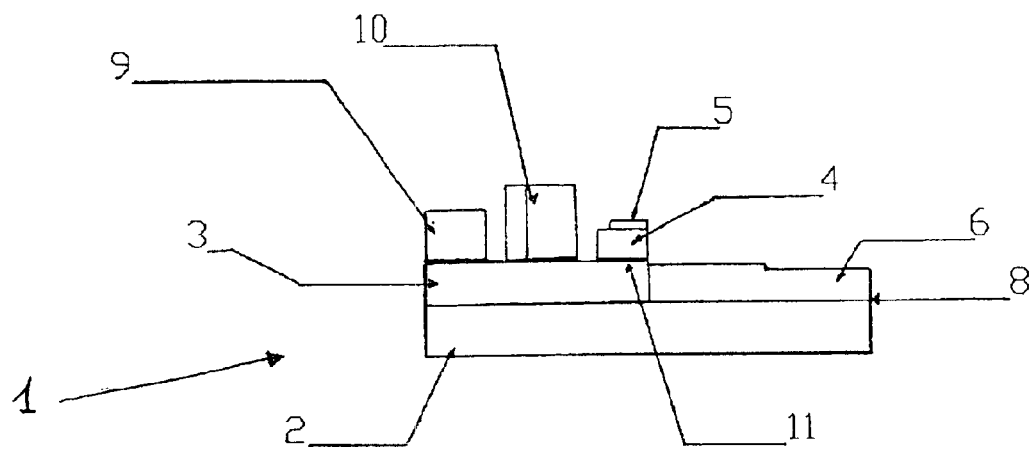
FIG. 1(*a*) is a side view of a conventional optical assembly.
Figure 1B:
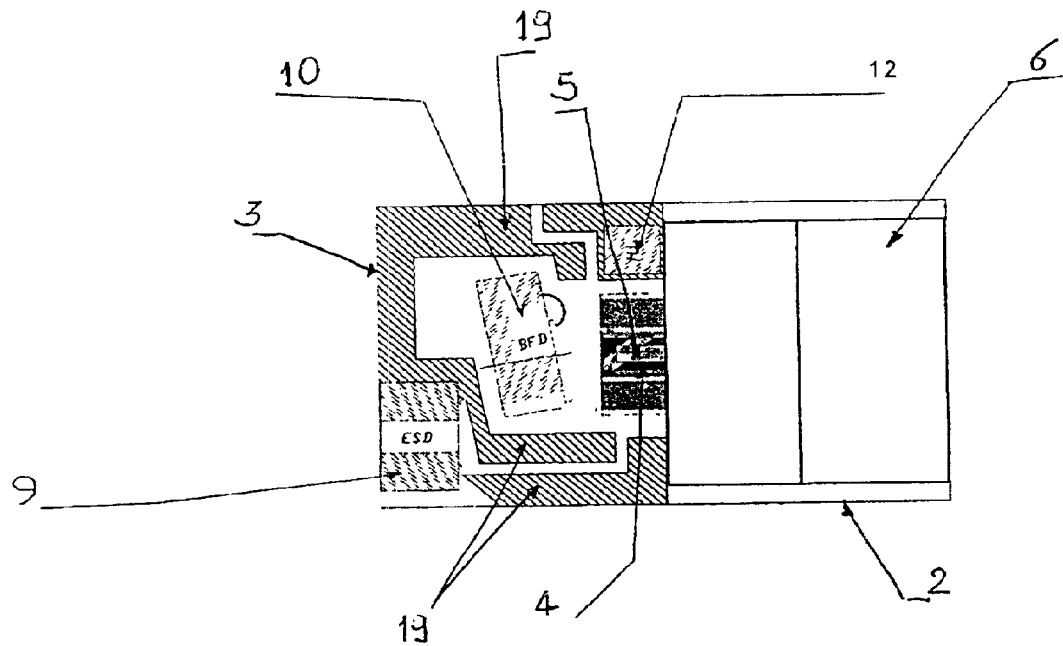
Figure 2:
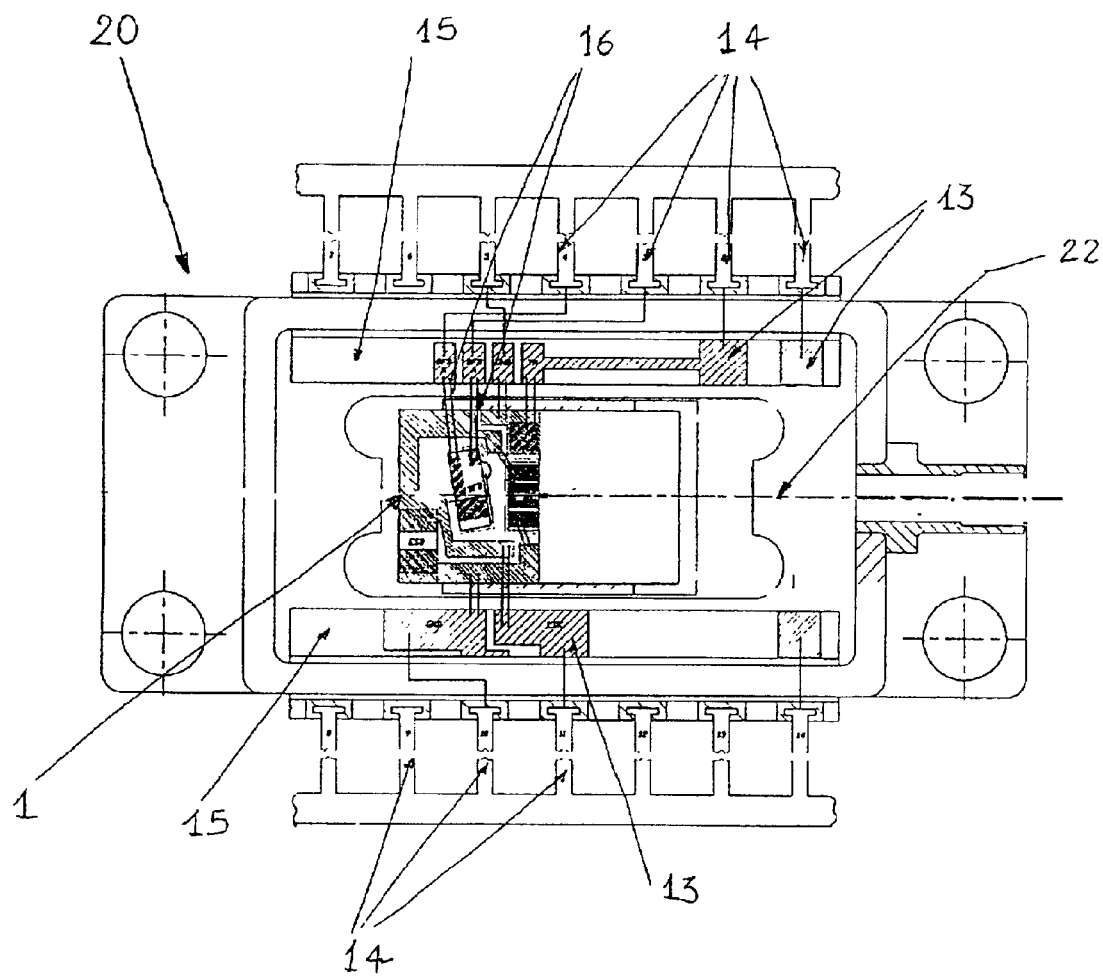
FIG. 2 is a top view of a butterfly package provided with a ceramic feed-through and housing the optical assembly of FIG. 1.

The optical bench according to the present invention is suitable for seal-around technology. The use of one-piece highly thermally conductive ceramic board as optical bench combined with the use of a package using seal-around technology greatly lowers the manufacturing costs of the laser package while maintaining the requirements of standard pin-out positioning and of package reliability. Another advantage of packages using a seal-around technology, is that the distance between the terminal pins and the optical bench is larger than the distance between the ceramic terminal feed-through and the optical bench of a package according to the related art described in FIG. 2. Thus, the power dissipated from the package with straight sealed-around pins to the optical bench is less than the power dissipated from a package of the same dimension provided with a ceramic terminal feed-through, all the external conditions and the optical assembly being the same for both packages.

Figure 4:
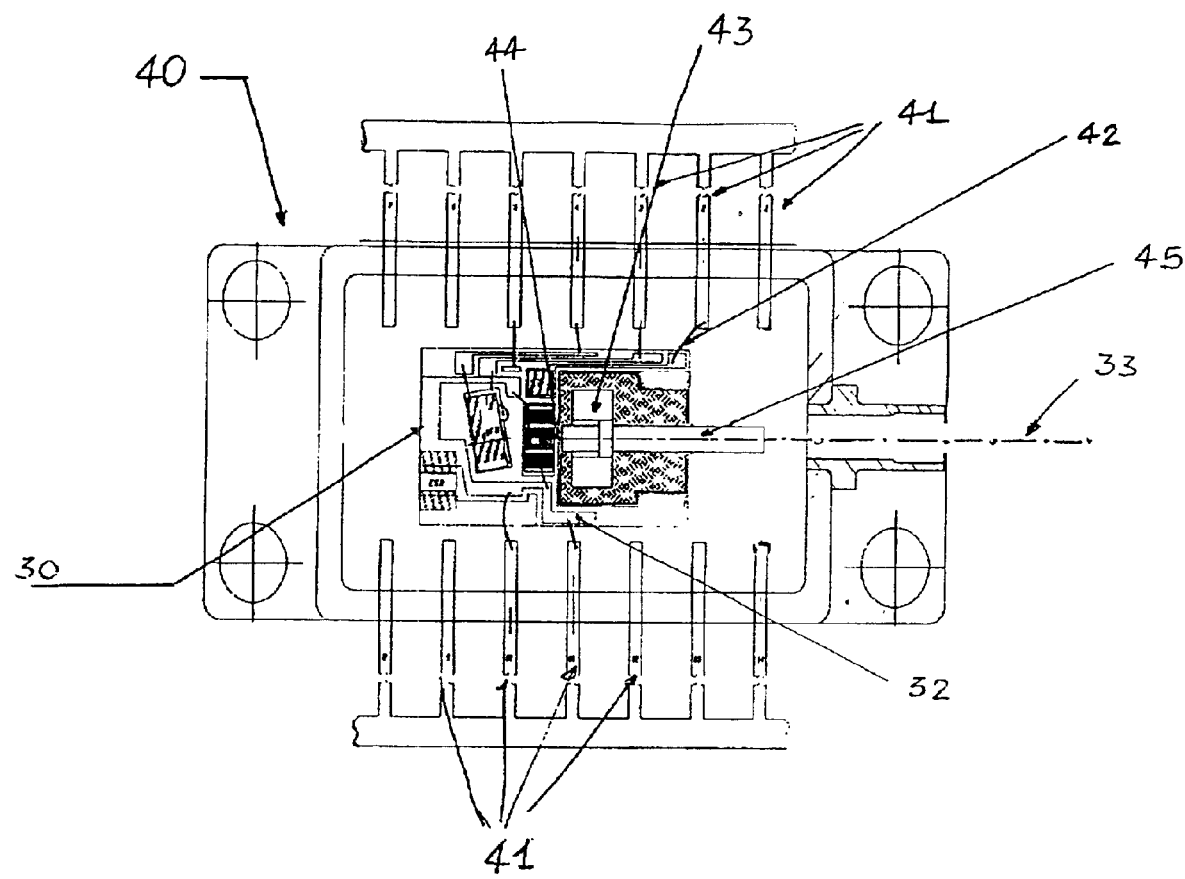
FIG. 4 is a plan view of a butterfly package with straight terminal pins housing the optical bench according to a first embodiment of the invention.

FIG. 4 shows a 14-pin butterfly optoelectronic package 40 with two rows of straight terminal pins 41 that extend through apertures on the side surfaces of the package. The two rows of terminal pins are substantially parallel to the optical axis 33 of the optical bench. Terminal pins 41 are hermetically sealed in the apertures of the package ("seal-around"). The package 40 houses the optical bench 30 according to the first embodiment of the present invention (FIG. 3). In FIG. 4, on the welding platform 31 a metallic (e.g., of Kovar) saddle or clip 43 is welded, e.g., by laser welding, so as to secure the optical fibre 44, which is inserted in a ferrule 45, in aligned position with respect to the laser 5. The tip of the fibre 44 is placed near the output of the laser 5. A microlens can be formed on or mounted at the fibre tip so as to maximise coupling from the laser. Alternatively, a graded index lens can be placed between the fibre and the laser, always to improve optical coupling. Although in FIGS. 3 and 4 we show a single welding platform mounted on a fixing region of the optical bench, different designs of welding platform can be contemplated depending on the aligning method for the fibre-laser optical coupling that will be used.

Referring again to FIG. 4, metallised tracks 32 extending on the optical bench surface in direction essentially parallel to the optical axis 33 ensure the correct position of pin-out. From circuit patterns 32 of the optical bench to the corresponding external pins 41 relatively short bonding wires 42 or the like are required, thereby minimising the electrical inductance. We emphasise that the presence of metallised tracks extending at least partly on the side of the fixing region of the optical bench simplifies the package structure and its manufacture.

Although the optical bench according to the present invention finds an advantageous application in laser packages using seal-around technology, the above-described design is compatible also with packages provided with ceramic terminal feed-through's for the pin-out. In fact, also in this case, the advantages of a low-cost optical bench of simplified design and of good thermal properties according to the present invention remain significant. Furthermore, also for packages provided with ceramic feed-through the presence of metallised peripheral tracks makes the right pin-out connection easy.

Package integration can be improved by placing the ceramic optical bench of the present invention directly on top of the Peltier cooling elements. Peltier coolers are often constructed having Peltier cooling elements sandwiched between lower and upper plates, generally made of AlN or alumina in order to have a good heat dissipation. By using a baseplate with excellent thermal properties, as in the above-described embodiments, the ceramic upper plate of the Peltier cooler can be eliminated and the optical bench integrated on the Peltier elements, thus further reducing the assembly costs.

Figure 5A:
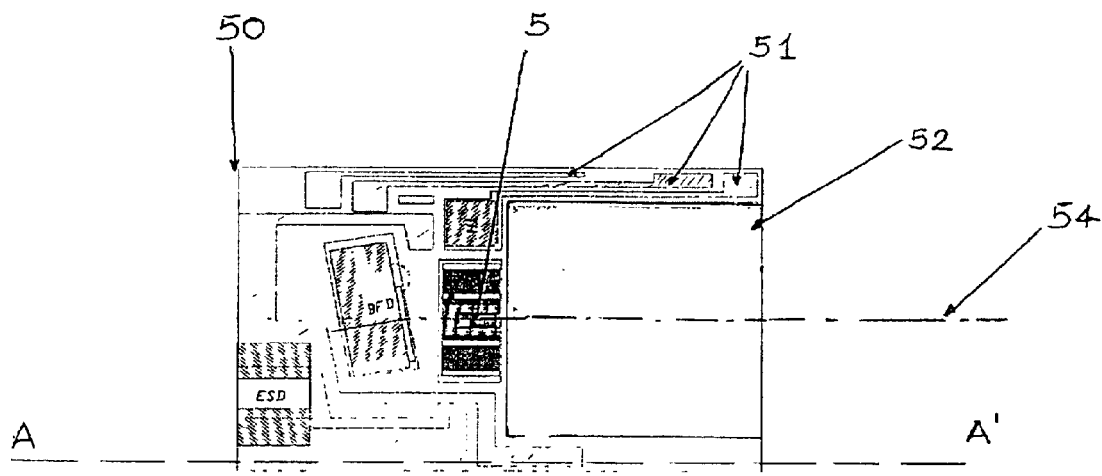
FIG. 5(a) is a top view of an optical bench according to a second embodiment of the invention.
Figure 5B:
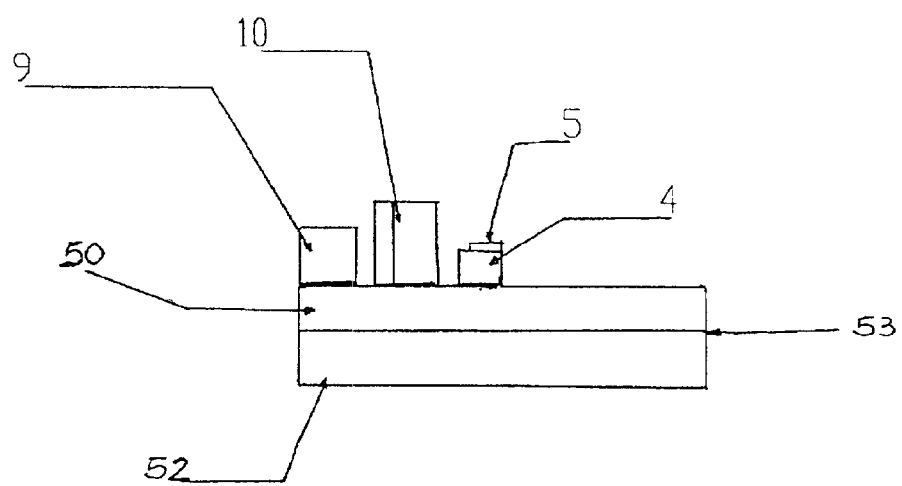
FIG. 5(b) is a side view of an optical bench of FIG. 5(a) taken along the line AA'.

We have described the preferred modes of carrying out the invention. An alternative solution to the problem of having a correct pin-out in low-cost packages, could be to have a two-substrate structure, in particular an insulating U-shaped circuit board mounted on a rigid baseplate. This second embodiment is shown in FIG. 5. A rigid U-shaped circuit board 50 of an insulating material is mounted on a baseplate 52, e.g., bonded to the baseplate by high-temperature solder 53. Co-firing can be used instead of soldering for bonding the circuit board to the baseplate. Both substrates can be made of a material of high thermal conductivity such as an AlN based material. The baseplate 52 can be made also of a metallic material having high thermal conductivity, such as Cu—W alloy. The U-shaped legs of the circuit board 50 project in the longitudinal direction of the baseplate, i.e., in a direction substantially parallel to the optical axis 54. U-shaped legs are provided with metallised tracks 51. One or more welding platforms can be placed in the fixing region of the circuit board 50 between the U-shaped legs and attached to the top surface of baseplate 52.

Figure 6A:
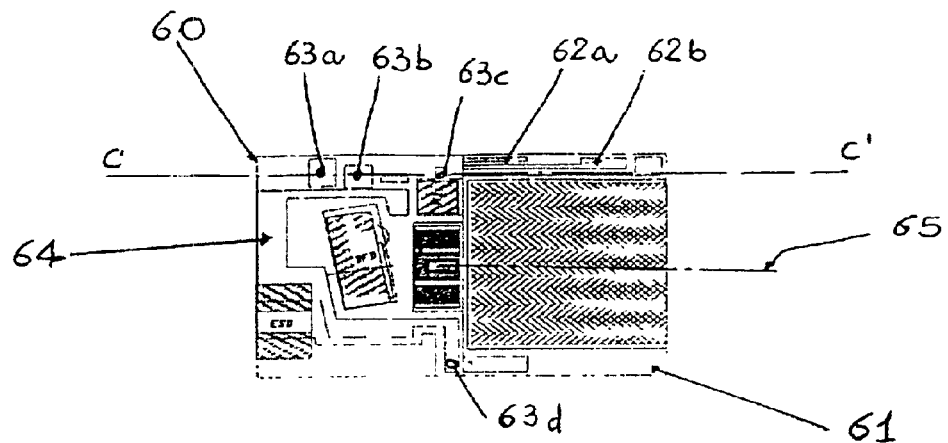
FIG. 6(a) is a top view of an optical bench according to a third embodiment of the invention.
Figure 6B:
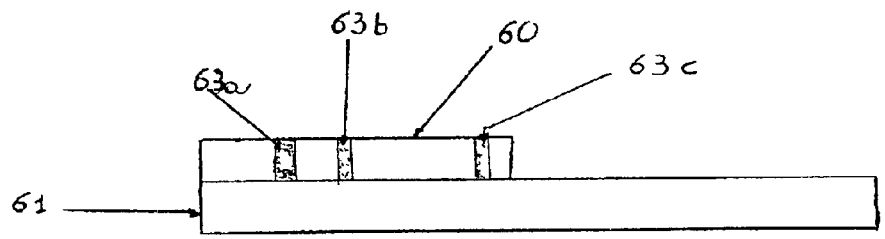
FIG. 6(b) is a side view of an optical bench of FIG. 6(a) taken along the line CC'.
Figure 6C:
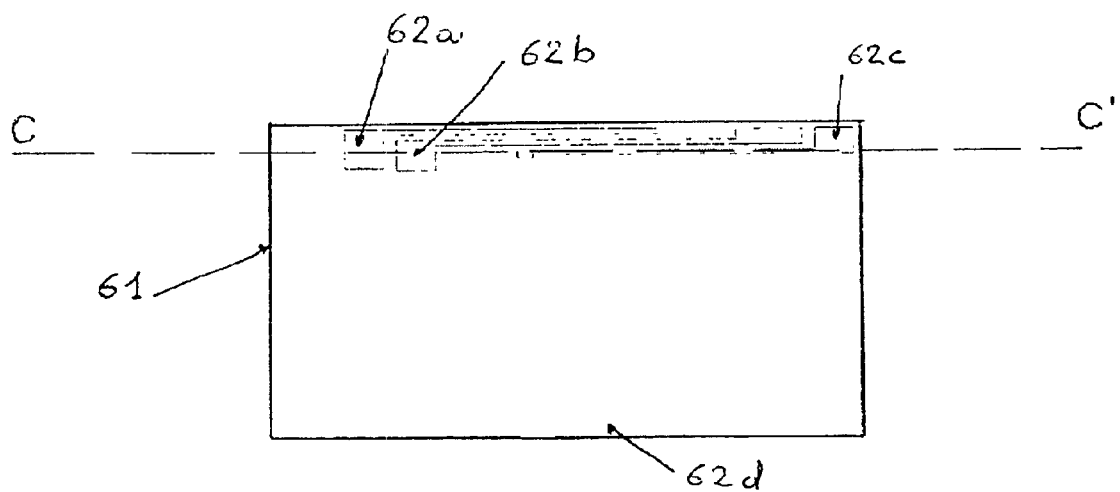
FIG. 6(c) is a top view of the baseplate of FIG. 6(a).

Another two-substrate solution could be the use of conductive vias through an insulating circuit board, which is provided with circuit patterns and through-holes and which is placed on an insulating baseplate. This third embodiment of the present invention is shown in FIG. 6. FIG. 6(a) shows the top view of the optical bench. A circuit board 60 provided with circuit patterns 64 and metallised through-holes 63 [indicated in FIGS. 6(a) and 6(b) as 63a to 63d] is bonded to a rigid baseplate 61. Peripheral metallised tracks 62 [indicated in FIGS. 6(a) and 6(c) as 62a to 62d] are present on the top surface of the baseplate 61 and extend along a region of baseplate 61 on a side of a fixing region, shown as hatched in FIG. 6(a), reserved for mounting a welding platform. Preferably, circuit board 60 and baseplate 61 are made of AlN based materials. Through-holes 63 in the circuit board act as conductive vias to electrically connect the circuit patterns 64 on the top surface of the circuit board 60 with the metallised tracks 62 placed on the periphery of the baseplate 61 and extending along a direction substantially parallel to the optical axis 65. Metallised tracks 62 on the baseplate 61 make the connections to the external terminal pins.

However, we note that the alternative solutions shown in FIGS. 5 and 6 would be more expensive to realise than the solution of an optical bench comprising a single ceramic baseplate as described in the first embodiment of the invention.

Although the detailed description refers to a laser package, it is worth remarking that the invention applies to any optoelectronic package in which an optical bench includes optical components, such as lenses, fibres or fibre arrays in multichip devices. Any package housing an optoelectronic device that requires heat dissipation and welding of optical components could benefit from the present invention.

We have shown packages using seal-around technology for external pin-out connection as an example of low-cost packages. However, the invention applies also to packages provided with other straight pin-out technologies, such as compression-type glass (or ceramic) lead-through.

The above detailed description is only illustrative of the invention, which is not restricted to the preferred embodiments. Modifications will be obvious to those with skill in the art and will not depart from the scope of the invention as it is defined by the following claims.

What is claimed is:

1. An optical bench for optoelectronic packages comprising a rigid insulating substrate, said substrate having a top surface along which it is defined an optical axis, said substrate comprising:
   a device region for mounting at least an optoelectronic device in alignment with said optical axis, and
   a fixing region adjacent to the device region for affixing at least an optical component in alignment with the optical axis,
   wherein said substrate further comprises a third region provided with metallised tracks, said circuit pattern region extending over the substrate top surface along at least part of one side of said fixing region in a direction substantially parallel to the optical axis.

2. The optical bench of claim 1, wherein the substrate is made of a material with thermal conductivity larger than or equal to 140 W/mK.

3. The optical bench of claim 1, wherein the substrate is made of a ceramic material.

4. The optical bench of claim 2, wherein the substrate is made of an aluminium nitride based material.

5. The optical bench of claim 1, wherein the optoelectronic device is a laser.

6. The optical bench of claim 5, wherein said optical component is an optical fiber.

7. The optical bench of claim 1, further comprising a heat dissipating block for the optoelectronic device, said dissipating block being mounted on the device region of the substrate.

8. The optical bench of claim 1, further comprising a welding platform attached to the fixing region of the substrate.

9. The optical bench of claim 1, wherein said circuit pattern comprises a circuit board mounted on said substrate and having metallised paths electrically connected to said metallised tracks by metallised through-holes.

10. The optical bench of claim 1, wherein said substrate is a U-shaped circuit board that is mounted on a rigid baseplate, the optical bench further comprising a welding platform attached to the baseplate in a position corresponding to the space between the U-shaped legs of the circuit board.

11. An optoelectronic package housing an optical bench according to claim 1.

12. An optoelectronic package according to claim 11, comprising an optoelectronic device mounted on the device region so as to be aligned with said optical axis and at least an optical component mounted on the fixing region so as to be aligned with the optical axis.

13. An optoelectronic package according to claim 12, wherein the optoelectronic device is a laser with a light emission path aligned with said optical axis and the optical component is an optical fibre.

14. The optoelectronic package according to claim 13, wherein the device region further comprises at least one complementary device and said metallised tracks are connected to at least one complementary device or to the laser.

15. A packaged optoelectronic device comprising:
a package;
at least a row of external terminal pins for electrical connection to the exterior of the package, said row extending in a direction substantially parallel to a package surface; and an optical bench housed in said package comprising a rigid insulating substrate, said substrate having a top surface along which it is defined an optical axis substantially parallel to said row of external pins, wherein;

said substrate comprises a device region having at least an optoelectronic device mounted thereon, a light path of the optoelectronic device being aligned with said optical axis, and a fixing region adjacent to the device region for affixing an optical fibre in a position aligned with the optical axis, and said substrate further comprises a circuit pattern region provided with metallised tracks, said circuit pattern region extending over the substrate top surface along at least part of one side of said fixing region in a direction substantially parallel to the optical axis.

16. The packaged optoelectric device of claim 15 wherein the at least said row of external pins extend through apertures on an exterior side surface of the package to an interior side of the package for short electrical inductive connection to the exterior of the package.

17. The packaged optoelectric device of claim 16 wherein said circuit pattern has metallised paths electrically connected to said metallised tracks by metallised through-holes for minimizing electrical inductance.

18. The optical bench of claim 1, wherein said circuit pattern has metallised paths electrically connected to said metallised tracks by metallised through-holes.

19. The optical bench of claim 16, wherein said metallised paths are bonding wires for providing wire bonds over the substrate top surface along said at least part of one side of said fixing region in said direction substantially parallel to the optical axis.

* * * * *